(12) United States Patent
Bjorkman et al.

(10) Patent No.: US 7,110,629 B2
(45) Date of Patent: *Sep. 19, 2006

(54) OPTICAL READY SUBSTRATES

(75) Inventors: Claes Bjorkman, Los Altos Hills, CA (US); Lawrence C. West, San Jose, CA (US); Dan Maydan, Los Altos Hills, CA (US); Samuel Broydo, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/623,666

(22) Filed: Jul. 21, 2003

(65) Prior Publication Data

US 2004/0114853 A1    Jun. 17, 2004

Related U.S. Application Data

(63) Continuation-in-part of application No. 10/280,505, filed on Oct. 25, 2002.

(60) Provisional application No. 60/397,552, filed on Jul. 22, 2002.

(51) Int. Cl.
*G02B 6/12* (2006.01)
(52) U.S. Cl. ....................................................... 385/14
(58) Field of Classification Search .................. 385/14, 385/129–132
See application file for complete search history.

(56) References Cited

U.S. PATENT DOCUMENTS

| 3,217,856 A | 11/1965 | Miles .......................... 197/127 |
| 4,006,432 A | 2/1977 | Streifer et al. .......... 331/94.5 C |
| 4,100,562 A | 7/1978 | Sugawara et al. ............. 357/19 |
| 4,368,481 A | 1/1983 | Ohashi et al. ................. 357/30 |
| 4,438,447 A | 3/1984 | Copeland, III et al. ........ 357/19 |
| 4,720,468 A | 1/1988 | Menigaux et al. ........... 437/129 |
| 4,734,910 A | 3/1988 | Izadpanah ..................... 372/18 |
| 4,759,023 A | 7/1988 | Yamaguchi ................... 372/26 |
| 4,959,540 A | 9/1990 | Fan et al. ............... 250/227.12 |
| 4,966,430 A | 10/1990 | Weidel |
| 4,980,568 A | 12/1990 | Merrick et al. .............. 250/551 |
| 5,098,861 A | 3/1992 | Blackstone |
| 5,190,883 A | 3/1993 | Menigaux et al. .............. 437/3 |
| 5,193,131 A | 3/1993 | Bruno .......................... 385/14 |

(Continued)

FOREIGN PATENT DOCUMENTS

WO    0 661 561 A2    12/1994

(Continued)

OTHER PUBLICATIONS

U.S. Appl. No. 10/623,665, filed Jul. 21, 2003, West et al.

(Continued)

*Primary Examiner*—Sarah Song
(74) *Attorney, Agent, or Firm*—Wilmer Cutler Pickering Hale & Dorr LLP

(57) ABSTRACT

An article of manufacture comprising an optical-ready substrate made of a first semiconductor layer, an insulating layer on top of the first semiconductor layer, and a second semiconductor layer on top of the insulating layer, wherein the second semiconductor layer has a top surface and is laterally divided into two regions including a first region and a second region, the top surface of the first region being of a quality that is sufficient to permit microelectronic circuitry to be formed therein and the second region including an optical signal distribution circuit formed therein, the optical signal distribution circuit made up of interconnected semiconductor photonic elements and designed to provide signals to the microelectronic circuit to be fabricated in the first region of the second semiconductor layer.

21 Claims, 4 Drawing Sheets

U.S. PATENT DOCUMENTS

| | | | |
|---|---|---|---|
| 5,195,161 A | 3/1993 | Adar et al. | |
| 5,291,010 A | 3/1994 | Tsuji | 250/208.1 |
| 5,298,787 A | 3/1994 | Bozler et al. | 257/592 |
| 5,345,557 A | 9/1994 | Wendt | 395/200 |
| 5,357,122 A | 10/1994 | Okubora et al. | 257/84 |
| 5,382,810 A | 1/1995 | Isaksson | 257/81 |
| 5,463,229 A | 10/1995 | Takase et al. | 257/59 |
| 5,485,021 A | 1/1996 | Abe | |
| 5,523,557 A | 6/1996 | Bruno | 250/214.1 |
| 5,536,974 A | 7/1996 | Nishiguchi | 257/778 |
| 5,548,433 A | 8/1996 | Smith | 359/158 |
| 5,569,934 A | 10/1996 | Fujii et al. | 257/21 |
| 5,604,361 A | 2/1997 | Isaksson | 257/99 |
| 5,633,527 A | 5/1997 | Lear | 257/432 |
| 5,663,592 A | 9/1997 | Miyazawa et al. | 257/627 |
| 5,728,605 A | 3/1998 | Mizutani | 438/41 |
| 5,767,508 A | 6/1998 | Masui et al. | 250/227.11 |
| 5,801,872 A | 9/1998 | Tsuji | 359/248 |
| 5,812,708 A | 9/1998 | Rao | 385/14 |
| 5,825,051 A | 10/1998 | Bauer et al. | 257/82 |
| 5,828,679 A | 10/1998 | Fisher | 372/6 |
| 5,854,804 A | 12/1998 | Winer et al. | 372/38 |
| 5,889,903 A | 3/1999 | Rao | 385/14 |
| 5,945,720 A | 8/1999 | Itatani et al. | 257/432 |
| 5,946,438 A | 8/1999 | Minot et al. | 385/88 |
| 5,970,081 A | 10/1999 | Hirayama et al. | 372/96 |
| 5,987,196 A | 11/1999 | Noble | 385/14 |
| 6,011,296 A | 1/2000 | Hassard et al. | 257/448 |
| 6,031,243 A | 2/2000 | Taylor | 257/13 |
| 6,043,515 A | 3/2000 | Kamiguchi et al. | 257/103 |
| 6,066,860 A | 5/2000 | Katayama et al. | 257/71 |
| 6,093,939 A | 7/2000 | Artigue et al. | 257/99 |
| 6,125,217 A | 9/2000 | Paniccia et al. | 385/14 |
| 6,202,165 B1 | 3/2001 | Pine | 713/500 |
| 6,232,142 B1 | 3/2001 | Yasukawa | 438/69 |
| 6,288,410 B1 | 9/2001 | Miyazawa | 257/14 |
| 6,310,372 B1 | 10/2001 | Katayama et al. | 257/291 |
| 6,318,901 B1 | 11/2001 | Heremans et al. | 385/53 |
| 6,320,204 B1 | 11/2001 | Hirabayashi et al. | 257/71 |
| 6,343,171 B1 | 1/2002 | Yoshimura et al. | 385/50 |
| 6,346,717 B1 | 2/2002 | Kawata | 257/72 |
| 6,392,342 B1 | 5/2002 | Parikka | 313/512 |
| 6,393,183 B1 | 5/2002 | Worley | 385/39 |
| 6,403,395 B1 | 6/2002 | Hirabayashi et al. | 438/69 |
| 6,407,438 B1 | 6/2002 | Severn | 257/433 |
| 6,449,411 B1 * | 9/2002 | Nakamura | 385/40 |
| 6,528,779 B1 | 3/2003 | Franz et al. | 250/214.1 |
| 6,645,829 B1 | 11/2003 | Fitzgerald | 438/455 |
| 6,658,173 B1 * | 12/2003 | Delwala | 385/15 |
| 6,677,655 B1 | 1/2004 | Fitzgerald | 257/432 |
| 6,680,495 B1 * | 1/2004 | Fitzergald | 257/183 |
| 2002/0146865 A1 | 10/2002 | Hoel | |
| 2002/0174826 A1 | 11/2002 | Maydan et al. | 117/84 |
| 2002/0174827 A1 | 11/2002 | Samoilov et al. | 117/84 |
| 2002/0181825 A1 * | 12/2002 | Johnson et al. | 385/14 |
| 2003/0015720 A1 | 1/2003 | Lian et al. | 257/98 |
| 2003/0025118 A1 | 2/2003 | Yamazaki et al. | 257/79 |
| 2003/0052082 A1 | 3/2003 | Khan et al. | 216/24 |
| 2003/0052088 A1 | 3/2003 | Khan et al. | 216/67 |
| 2003/0072548 A1 | 4/2003 | Bhardwaj et al. | 385/129 |
| 2003/0110808 A1 | 6/2003 | M'Saad et al. | 65/379 |
| 2003/0113085 A1 | 6/2003 | M'Saad | 385/129 |
| 2003/0114006 A1 | 6/2003 | White | 438/694 |
| 2004/0012041 A1 | 1/2004 | King et al. | |
| 2004/0012401 A1 | 1/2004 | West et al. | 257/228 |
| 2004/0013338 A1 | 1/2004 | Bjorkman et al. | 385/14 |

FOREIGN PATENT DOCUMENTS

| | | |
|---|---|---|
| WO | 0 661 561 A3 | 12/1994 |
| WO | WO 03/036369 A1 | 5/2003 |

OTHER PUBLICATIONS

Janz et al.(1998) "Optical Properties of Pseudomorphic Si1-xGex for Si-Based Waveguides at the $\lambda$=1300-nm and 1550-nm Telecommunications Wavelength Bands". *IEEE Journal of Selected Topics in Quantum Electronics.* vol. 4 (6).

Schuppert et al. (1999) "Optical Channel Waveguides in Silicon Diffused from GeSi Alloy". *Electronics Letters.* vol. 25 (22).

Soref et al. (1991) "Large Single-Mode Rib Waveguides in GeSi-Si and Si-on-SiO2" *IEEE Journal of Quantum Electronics.* vol. 27 (8).

Sorel et al. (1990) "Optical Waveguiding in a Single-crystal Layer of Germanium Silicon Grown on Silicon" *Optics Letters.* vol. 15(5).

Splett et al. (1990) "Low Loss Optical Ridge Waveguides in a Strained GeSi Epitaxial Layer Grown on Silicon". *Electronics Letters.* vol. 26(14).

Chen et al., "Fully Embedded Board-Level Guided-Wave Optoelectronic Interconnects," Proceedings of the IEEE, vol. 88, No. 6, Jun. 2000, pp. 780-793.

Choi et al., "Self-Aligning Silicon Groove Technology Platform for the Low Cost Optical Module," 1999 Electronic Components and Technology Conference, IEEE, 1999, pp. 1140-1144.

Irace et al., "Fast Silicon-on-Silicon Optoelectronic Router Based on a BMFET Device," IEEE Journal of Selected Topics in Quantum Electronics, vol. 6, No. 1, Jan./Feb. 2000, pp. 14-18.

Jalali et al., "Advances in Silicon-on-Insulator Optoelectronics," IEEE Journal of Selected Topics in Quantum Electronics, vol. 4, No. 6, Nov./Dec. 1998, pp. 938-947.

Kimerling, "Photons to the Rescue: Microelectronics Becomes Microphotonics," The Electrochemical Society *Interface*, Summer 2000, pp. 28-31.

Kostal, "Nano-optics Changes the Rules for Optical Components," NanoOpto White Paper 2002.001, Jun. 2002, pp. 1-6.

Kostal and Park, "Nano-optics: New Rules for Optical System Design," NanoOpto White Paper 2002.002, Jun. 2002, pp. 1-10.

Motorola Labs, "The Discovery: Motorola Labs solves a 30-year semiconductor industry puzzle," Jun. 2002.

Schaub et al., "High-Speed Monolithic Silicon Photoreceivers on High Resistivity and SOI Substrates," Journal of Lightwave Technology, vol. 19, No. 2, Feb. 2001, pp. 272-278.

Yabu et al., "New Design Method for Low-Loss Y-Branch Waveguides," Journal of Lightwave Technology, vol. 19, No. 9, Sep. 2001, pp. 1376-1384.

Tashiro et al., "A Selective Epitaxial SiGe/Si Planar Photodetector for Si-Based OEIC's " IEEE Transactions on Electronic Devices, vol. 44, No. 4, Apr. 1997, pp. 545-550.

Walker and Jahns, "Optical clock distribution using integrated free-space optics," Optics Communications 90 (1992) pp. 359-371.

Walker et al., "Design and fabrication of high-efficiency beam splitters and beam deflectors for integrated planar micro-optic systems," Applied Optics, vol. 32, No. 14, May 10, 1993, pp. 2494-2501.

* cited by examiner

OPTICAL READY SUBSTRATES

This application is a continuation-in-part of U.S. application Ser. No. 10/280,505 filed Oct. 25, 2002, which claims the benefit of provisional Application No. 60/397,552, filed Jul. 22, 2002.

TECHNICAL FIELD

The invention relates to substrates on which microelectronics circuits and devices can be fabricated.

BACKGROUND

As features on microelectronic circuits become smaller and as device speeds increase, we have been fast approaching the limits inherent in the electrical communication of signals. The capacitances in the microelectronic circuits along the electrical connections cause delays that cannot be ignored. More and more sophisticated techniques have been required to circumvent or push back these limitations. One direction in which people have turned their efforts has been to use photons instead of electrons to communicate information. Optical signals are not affected by capacitance, inductance, and ohmic resistance that are present in the circuit elements and photons travel much faster than the electrons. As a consequence, in recent years there have been many advances in the field of optical communication and processing of signals and in optical media and devices that enable optical communication and processing.

These efforts have also had their impact on the integrated circuit fabrication industry as more people search for ways to combine or integrate photonic elements with the microelectronic devices that have been fabricated on IC chips. There have been many recent advances involving the fabrication of optical waveguide structures on silicon substrates, the fabrication of photodetectors to convert the light to electrical signals that can be used by conventional microelectronic circuitry and the fabrication of light emitters or laser elements for converting the electrical signals to optical signals.

SUMMARY

In general, in one aspect, the invention relates to making optical-ready semiconductor substrates upon which microelectronic circuitry can be fabricated using conventional semiconductor fabrication techniques. In the case of completely optical-ready substrates, the semiconductor manufacturer need not be concerned with either developing the technology or know how to produce the optical components on the wafer nor need the processes that have been optimized for fabricating the semiconductor microelectronics be modified to accommodate the fabrication of the optical components. In other words, the semiconductor circuit manufacturer can, except for locating and making connections to the optical signal distribution network, process the wafer just as though it was a blank semiconductor wafer. In the case of less than completely optical-ready substrates, the semiconductor manufacturer is relieved of having to modify its processes for those optical components that are already fabricated into the substrate.

In general, in one aspect, the invention features an article of manufacture including an optical-ready substrate made of a first semiconductor layer, an insulating layer on top of the first semiconductor layer, and a second semiconductor layer on top of the insulating layer, wherein the second semiconductor layer has a top surface and is laterally divided into two regions including a first region and a second region. The top surface of the first region is of a quality that is sufficient to permit microelectronic circuitry to be formed therein and the second region includes an optical signal distribution circuit formed therein. The optical signal distribution circuit is made up of interconnected semiconductor photonic elements and is designed to provide signals to the microelectronic circuit to be fabricated in the first region of the second semiconductor layer.

Other embodiments of the invention include one or more of the following features. The semiconductor photonic elements of the optical signal distribution circuit include optical waveguides and output elements coupled to the optical waveguides for delivering signals carried by the waveguides to the microelectronic circuitry. The output elements are optical detectors which convert optical signals to electrical signals. The optical signal distribution network is an optical clock signal distribution network. The first semiconductor layer comprises silicon; the insulating layer comprises a silicon oxide; and the second semiconductor layer comprises silicon. The combination of the first semiconductor layer, the insulating layer and the second semiconductor layer is an SOI structure. The second region of the second semiconductor layer is thicker than the first region of the second semiconductor layer. The top surface of the first region is of a quality that is sufficient to permit CMOS circuitry to be formed therein.

In general, in another aspect, the invention features an article of manufacture including a first semiconductor chip including an optical signal distribution circuit formed in the topside thereof; and a second semiconductor chip including a microelectronic circuit formed in the topside thereof. The first chip is mounted on top of the second chip so that the topsides thereof are opposite each other and arranged so that the optical signal distribution circuit delivers signals to and/or receives signals from the microelectronic circuit when operating.

Other embodiments of the invention include one or more of the following features. The first semiconductor chip includes a first semiconductor layer, an insulating layer on top of the first semiconductor layer, and a second semiconductor layer on top of the insulating layer. The second semiconductor layer has a top surface with the optical signal distribution circuit formed therein. The optical signal distribution circuit is made up of interconnected semiconductor photonic elements. The semiconductor photonic elements of the optical signal distribution circuit include optical waveguides and output elements coupled to the optical waveguides for delivering signals carried by the waveguides to the microelectronic circuitry. The output elements are optical detectors which convert optical signals to electrical signals. The optical signal distribution network is a optical clock signal distribution network.

In general, in still another aspect the invention features a method involving, by using a first set of semiconductor fabrication processes, fabricating an optical-ready substrate having a first semiconductor layer, an insulating layer on top of the first semiconductor layer, and a second semiconductor layer on top of the insulating layer, wherein the second semiconductor layer has a top surface and is laterally divided into two regions including a first region and a second region, the top surface of the first region being of a quality that is sufficient to permit microelectronic circuitry to be formed therein and the second region including an optical signal distribution circuit formed therein, the optical signal distribution circuit made up of interconnected semiconductor photonic elements and designed to provide signals to the microelectronic circuit to be fabricated in the first region of the second semiconductor layer; and sending the optical-ready substrate to a purchaser that will subsequently fabricate the microelectronic circuitry in the first region of the second semiconductor layer of the optical-ready substrate by using a second set of semiconductor fabrication processes.

One big advantage of completely separating the optical signal distribution circuitry from the electrical circuitry is that it separates the electrical fabrication processes from the optical fabrication processes. Thus, for example, a company making CMOS circuitry that has optimized its fabrication processes for achieving ultra high precision and very high yields need not be concerned with having to modify its processes and possibly compromise its ultra high precision and high yields to also make optical elements along with the electrical components. Indeed, the company that fabricates the electrical components can simply rely on the expertise of an optical fabrication company to provide the optical elements and to optimize those processes. Developing and optimizing the optical fabrication processes will typically require special expertise and considerable research effort and that may be something that is not within the either the financial or technical ability of the company that fabricates the electrical circuits.

The electrical circuit fabricator can process the completely optical-ready substrate just as though it was a blank substrate, i.e., as a substrate that has no special requirements which must be taken into account when fabricating the electrical components. In the case of optical-ready substrates that are not completely optical-ready, there is still a significant advantage to the electrical circuit fabricator in the form of greatly reducing the ways in which the fabricator's semiconductor fabrication processes must be modified or changes to accommodate the inclusion of optical components.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
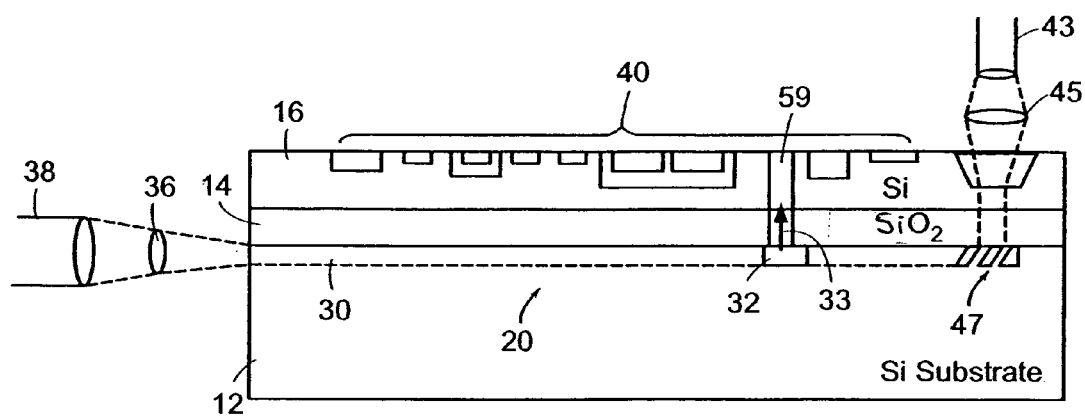
FIG. 1 is a schematic representation of a first embodiment of an optical-ready substrate.

The embodiment shown in FIG. 1 is an optical-ready substrate 10 that contains a semiconductor integrated optical signal distribution network 20 for distributing an optical clock signal to semiconductor integrated microelectronic circuitry 40 that will be later fabricated on the substrate above the optical circuitry. Optical-ready substrate 10 is an SOI (silicon-on-insulator) structure that includes a base substrate 12 of crystalline silicon, an insulating layer 14 of $SiO_2$, and a thin upper layer 16 of crystalline silicon. Optical signal distribution network 20 is fabricated in substrate 12 just below insulating layer 14. Network 20 includes three fundamental building blocks, namely, optical waveguides 30 for distributing the optical signals between different locations on the chip; photodetectors 32 for converting the optical signals to electrical signals 33 that will be used by corresponding components of the microelectronic circuitry; and splitters 34 (see FIG. 4) that divide the optical signals into multiple (in this case, two) components where branching occurs in the distribution network.

The optical input signal can be supplied in a number of different ways. According to one way, referred to generally as an edge coupling approach, a lens arrangement 36 focuses light from an external optical fiber 38 into optical waveguide 30. Alternatively, an optical fiber 43 delivers light through another arrangement of lenses 45 to waveguide 30 from a direction that is normal to the surface of the chip, from either above the chip through the top surface or under the chip through the backside. In that case, a reflecting element 47 fabricated within waveguide 30 redirects that light into waveguide 30 along its longitudinal axis. In both of the above examples, the lenses could be eliminated by placing the fiber in close proximity to a waveguide that allowed the light to couple directly. In either case, the efficiency of coupling is enhanced by creating a waveguide that can accept an optical beam shape similar to that of the fiber or lens focal spot. In another method, a fiber may not be used for transport of light, but rather the signal may emit from another waveguide device or an optical or laser source, such as a semiconductor laser, in the above examples. In yet another way, the optical signal is generated on the chip instead of being supplied by an external source. In this case, a light generating element 39 (see FIG. 4) is fabricated in waveguide 30 as part of optical signal distribution network 20 and is controlled by an externally supplied electrical signal. Examples of such light generating elements include lasers, modulators, and light emitting diodes.

Note that in this embodiment, all of the required optical circuit elements are located within optical signal distribution network 20 and the only signals that are provided to the microelectronic circuit by the optical network are electrical signals generated by photodetectors 32 within the buried optical network.

Figure 3:
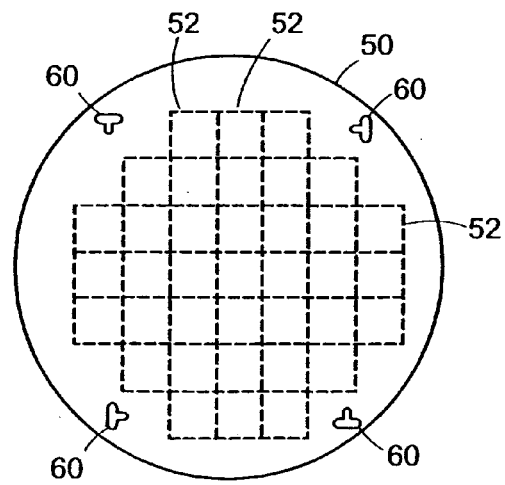
FIG. 3 illustrates alignment marks on the optical-ready substrate that are used to align subsequent masks for fabricating the microelectronic circuitry on the substrate.

Referring to FIG. 3, it is envisioned that an optical-ready wafer 50 would be fabricated with everything described above present in the wafer except the microelectronic circuitry. That is, the optical-ready wafer would include multiple chips 52 each with its own optical signal distribution network fabricated in the substrate below the insulator layer. The upper layer of silicon would be high quality planar semiconductor material that is ready for fabricating microelectronic circuitry by using conventional semiconductor fabrication processes that are optimized for building such circuitry (e.g. CMOS fabrication processes). Thus, a first company that specializes in fabricating integrated optical networks would build the optical-ready wafers according to a specification supplied by a second company that specializes in fabricating integrated microelectronic circuit. The first company would then deliver the optical-ready wafers to the second company and the second company would be able to process the wafers as though they were blank substrates and without having to modify or change its already optimized fabrication processes so as to also produce the integrated optical elements.

To help the second company to properly align its fabrication masks with the underlying optical network, visible alignment marks 60 are provided on the optical-ready wafer. These marks enable the semiconductor circuit manufacturer to know where the optical signals and/or the detected optical signals can be obtained. Since in many cases, it is likely that the optical signal distribution layout will be designed to interface with a particular set of fabrication masks for a specific microelectronic circuit design, the alignment marks need only provide an alignment reference for those later masks. Aligning the masks assures that the take out points for the optical signals are also properly aligned with the integrated microelectronic circuit. However, if the optical-ready substrate is not designed to conform to a specific set of electrical circuit fabrication masks but rather is a generic design around which subsequent electronic circuitry can be laid out, then the alignment marks will need to identify the actual locations of the input and output devices in the optical signal distribution circuit.

Various techniques for fabricating waveguides in a silicon substrate are known in the art. For a general discussion of some of this technology see "Photons to the Rescue: Microelectronics Becomes Microphotonics," L. C. Kimerling, The Electrochemical Society Interface, Summer 2000 (pp. 28–31). For a more specific discussion of some fabrication techniques see the following four U.S. patent applications that are assigned to Applied Materials Inc.: (1) U.S. Ser. No. 10/020,461, entitled "Method Of Manufacturing An Optical Core," filed Dec. 14, 2001; (2) U.S. Ser. No. 10/017,033, entitled "HDP-CVD Film For Uppercladding Application In Optical Waveguides," filed Dec. 14, 2001; (3) U.S. Ser. No. 09/866,172, entitled "Method For Fabricating Waveguides," filed May 24, 2001; and (4) U.S. Ser. No. 10/014,466, entitled "Waveguides Such As SiGeC Waveguides And Method Of Fabricating The Same," filed Dec. 11, 2001. All four of these U.S. patent applications are incorporated herein by reference.

To guide a particular wavelength λ of light by conventional waveguiding, a high refractive index core material is formulated or deposited in the medium along an appropriate path. Waveguide materials and processing are chosen to minimize loss due to absorption and scattering by the high-index core, among other design criteria like modal properties. A lower index cladding material may be fabricated around the core.

For silicon-based photonics circuits the medium of choice is doped and alloyed silicon. Hence, the band edge is around 1200 nm. At wavelengths significantly above this band edge, e.g., ≧1250 nm, silicon is optically transparent so the principal issue is loss properties of the waveguide core material, i.e., interior losses. Near or below 1200 nm the surrounding silicon is very lossy and the issue shifts to minimizing these effects, i.e., exterior losses. One practical option for limiting exterior losses is to minimize optical power transmitted directly through the silicon, as discussed in greater detail later. Some of the above-mentioned references describe using SiGe waveguides in a silicon substrate. Such embodiments are appropriate for optical signals having wavelengths greater than about 1200 nm, i.e., wavelengths for which the silicon substrate is relatively transparent. Also, this combination of materials (i.e., silicon and germanium) is particularly good due to its ability to yield low defect crystalline surfaces, which, as shall become apparent, is relevant to some other embodiments described below. A small amount of Ge can be added to a crystal layer during growth to create a higher index waveguide core, while minimizing strain and defects. This layer can be patterned and silicon can again be grown on top of this waveguide by other techniques.

The principle steps of an exemplary process for fabricating SiGe waveguides in Si substrates are as follows. First, trenches are etched into the substrate where the waveguides are to be located. Then, using a deposition process such as chemical vapor deposition (CVD), a series of layers are formed within the trenches. First, a blocking layer is deposited forming a thin protective wall in the trench. The blocking layer prevents contaminants from the substrate from diffusing into the waveguide and may be made of a compatible material such as epitaxial silicon. Then, a graded index SiGe layer is deposited on the blocking layer thereby forming another wall in the trench. In the graded layer the concentration of the Ge increases with the height of the graded layer. Next, a uniform index SiGe film is deposited onto the substrate filling the rest of the trench. This uniform index layer is the core of the optical waveguide.

After the uniform index payer has been deposited, chemical mechanical polishing (CMP) is used to remove the deposited layers from the upper surface of the wafer in regions outside of the trench. After the CMP, another graded index layer is deposited onto the wafer and is patterned so that it covers only the areas above the trench. Finally a cladding layer (e.g. Si) is deposited onto the wafer and CMP is used to planarize it, if appropriate.

Of course, it should be understood that there are additional processes associated with each of these steps (e.g. cleaning, etc.) but those additional processes are well known to persons skilled in the art and so we have not included them.

An alternative approach to forming the waveguides within trenches is to form islands of the material that will make up the core of the waveguide and then deposit silicon to fill in the regions between the islands.

There are also known techniques for designing and fabricating y-branch waveguides or splitters. Two representative articles are: "New Design Method for Low-Loss Y-Branch Waveguides," T. Yabu et al., Journal of Lightwave Technology, Vol. 19, No. 9, September, 2001, (pp. 1376–1384); and "Fast Silicon-on-Silicon Optoelectronic Router Based on a BMFET Device," A. Irace et al., IEEE Journal of Selected Topics in Quantum Electronics, Vol. 6, No. 1, January/February 2000 (pp. 14–18).

In the embodiments in which the silicon is transparent to the wavelengths that are carried by the waveguides, to make a photodetector which absorbs those wavelengths it will usually be necessary to add some other material to the silicon in the detector. One such material is germanium. There exists considerable knowledge on how to make SiGe detectors and such technology would be used to incorporate such detectors into the optical distribution network layer. An alternative would be to use other semiconductor compounds, such as the III-V compounds to construct optical detectors. One commonly used material is GaAs. Part of the issue with using any of these other materials is that they have different lattice constants from Si and they have different CTEs (coefficients of thermal expansion). However, if the devices are kept small in comparison to the total area of the chip, then these incompatibilities will not be serious.

There are also many articles in the prior art that describe photodetectors that could be fabricated as part of the integrated optical signal distribution network. See for example, the following three technical articles: "Advances in Silicon-on-Insulator Optoelectronics," B. Jalali et al., IEEE Journal of Selected Topics in Quantum Electronics, Vol. 4, No. 6, November/December 1998 (pp. 938–947); "A Selective Epitaxial SiGe/Si Planar Photodetector for Si-Based OEIC's," T. Tashiro et al., IEEE Transaction of Electron Devices, Vol. 44, No. 4, April, 1997 (pp. 545–550); and "High-Speed Monolithic Silicon Photoreceivers on High Resistivity and SOI Substrates," J. D. Schaub et al., Journal of Lightwave Technology, Vol. 19, No. 2, February 2001 (pp. 272–278).

In the first article, B. Jalili et al. discuss silicon-germanium heterostructures that implement Si-based optoelectronic detectors. They describe one detector that is fabricated by using molecular beam epitaxy to grow layers of the heterostructure on top of an SOI waveguide. That detector operates by detecting the evanescent field of the optical signal in the waveguide. They discuss another device that employs multiple layers of Ge grown directly on silicon. In the second article, T. Tashiro et al. describe a selective epitaxial growth SiGe/Si planar photodetector which could be used to convert the optical signals in the waveguides to electrical signals that can be used by the electronics that are to be fabricated in the upper layer. Their structure is fabricated by using cold-wall ultra-high-vacuum/chemical-vapor-deposition (UHV/CVD). Finally, in the third article J. D. Schaub et al. describe a lateral photodiode structure of the type that could be used to convert the optical signal in the optical waveguide to an electrical signal that can be passed up to the microelectronics in the upper layer.

At wavelengths significantly below 1200 nm (e.g. 850 nm and lower), silicon becomes opaque so it cannot be used as the core material of an optical waveguide. Thus, other materials must be used to construct the waveguides that can operate at the lower wavelengths. $SiO_2$ is an example of one such material that will transmit the shorter wavelengths.

Producing low-loss waveguiding in an opaque medium can be achieved by wrapping a transparent, lower index cladding around the waveguide core. This "insulating" layer reduces the optical power reaching the absorbing silicon but also introduces a "tunneling" loss mechanism. To appreciate tunneling loss recall that the optical field in the core is a propagating wave in both the radial and axial directions, but outside the core it is propagating in the axial direction and evanescent in the radial direction, i.e., decays exponentially outside the core. This exponential tail has some finite value where it intersects the interface between cladding and silicon. Since the index is much higher in the silicon (i.e., the speed of light is much lower), the tail produces "conical" radiating waves in the silicon that carry optical power away from the waveguide, producing loss. In practice, the weaker the tail at the cladding-silicon interface, the weaker the radiation, hence tunneling loss.

Figure 8:
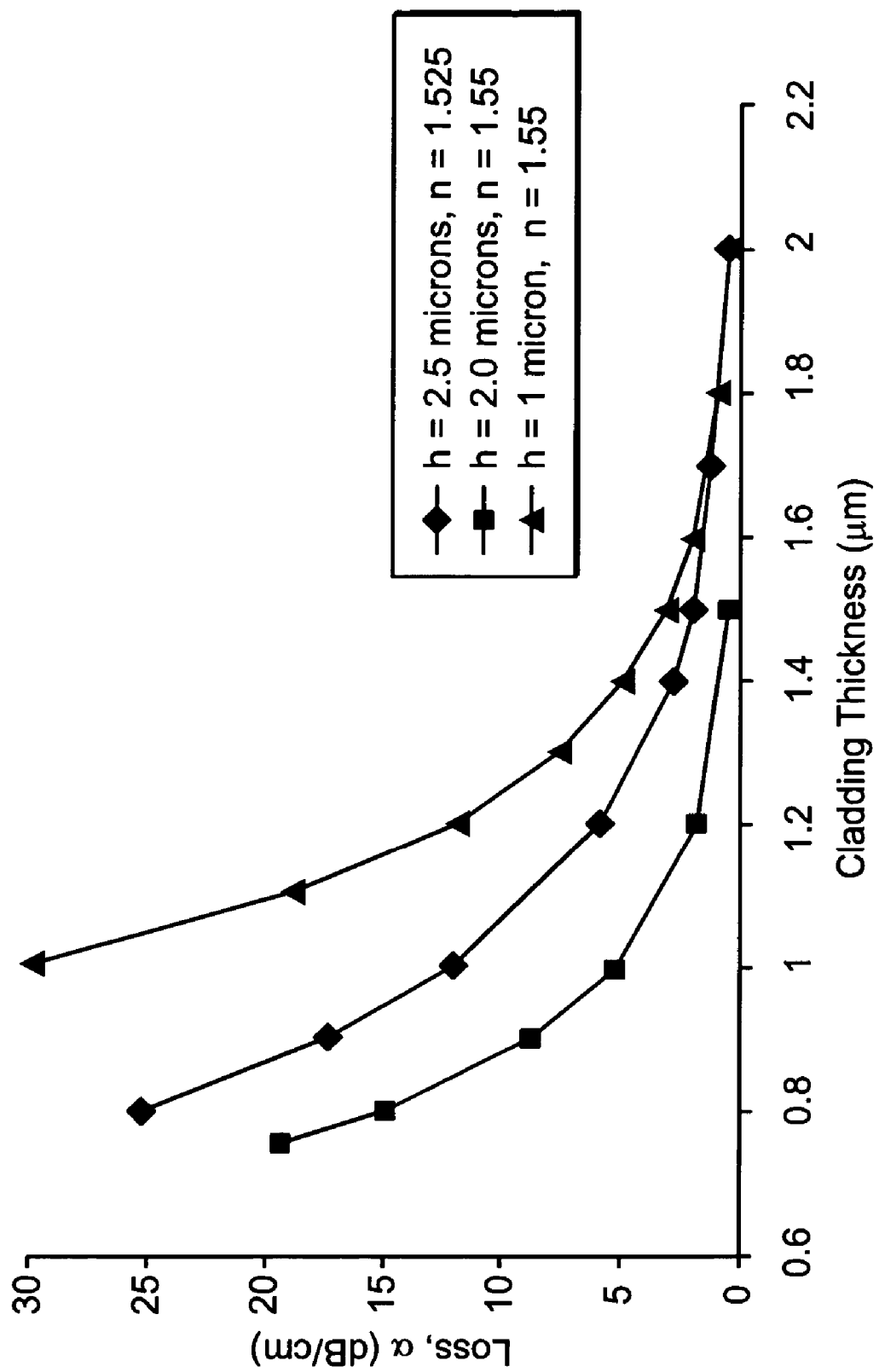
FIG. 8 is a graph showing losses versus cladding thickness for three different cores thicknesses.

An indication of losses and cladding thickness is shown in FIG. 8 for three slab (1D) waveguide models. These slabs are uniform and infinite in the lateral direction, for ease of calculation. The thickness of the core region is "h" and the thickness of the cladding on either side of the core region is of equal thickness and is one of the variables plotted in FIG. 8. An actual waveguide would, of course, be finite in the lateral direction as well (2D). The top and bottom of the model are terminated with perfectly matched layers (PMLs) to absorb the tunneled radiation. The plotted results are suggestive of the cladding dimensions and losses versus waveguide (slab) properties of interest here. Practical losses are fractions of a dB/cm so cladding thicknesses of at least two or three μm are probably necessary for the 2D cladded waveguide. Note that tunneling loss completely dominates absorption in the silicon, assuming $α_{si}$>1000/cm, say. Note also that higher modes losses are significantly greater than the fundamental mode losses plotted in FIG. 8, perhaps requiring twice the cladding thickness.

The natural choices for waveguide core/cladding materials in opaque silicon are doped silica, e.g., $GeO_2$ doping, or silicon oxynitride ($SiO_xN_y$) for the core, and silica ($SiO_2$) for the cladding. These are produced by a variety of techniques, most notably plasma enhanced chemical vapor deposition (PECVD) at low temperature, as well as ion exchange (molten salt) and flame hydrolysis deposition (and high temperature consolidation).

The change in index of refraction, Δn for doped silica can range up to about 0.05 $n_{silica}$ (5% contrast), e.g., from 1.45 to perhaps 1.52 (or 1.5 to 1.575). For silicon oxynitride the feasible range is from 1.45 (silica) to 2.02 (silicon nitride), i.e. Δn=0.39 $n_{silica}$. Specifics depend, of course, on the working wavelength. Therefore, significant index contrasts are potentially available. Results reported in the silica-on-silicon telecom literature on PECVD waveguides show that 5% contrast is typical for both doped silica and silicon oxynitride. It is likely that higher contrasts via increased concentration of nitrogen introduces other issues.

The down-side of PECVD is the incorporation of hydrogen due to low deposition temperature and the hydrogen-rich precursors, silane and ammonia. The N-H and Si-H bonds cause high losses in the near-IR, e.g., 1300 nm to 1500 nm, and at shorter wavelengths as well. The solution is a high temperature anneal, which may or may not be feasible depending on conditions of manufacture and application of the waveguide medium.

There are multiple known ways of fabricating waveguides for carrying the shorter wavelength signals. The description of one approach is presented in U.S. 2003/0052082 A1, published Mar. 20, 2003 (U.S. Ser. No. 09/957,395, filed Sep. 19, 2001), which is incorporated herein by reference.

A typical process for fabricating the cladded core waveguides in silicon might involve process steps that are similar to those described above for fabricating SiGe waveguides. In general, such a sequence would generally involves the following steps.

First, trenches are etched in the silicon substrate wherever the waveguide is intended to be. Then, using CVD, a silica under-cladding and side-cladding is grown on the inside walls of the trenches. After the silica under-cladding has been grown, CVD is used to grow a silicon oxynitride (or doped silica) core. After the core has been grown, CMP is used to remove the deposited layers down to the silicon substrate surface. Then, CVD is used to grow another silica layer for the over-cladding. The deposited silica layer is etched to form an over-cladding strip above on the side-cladding and core and remove it from areas above regions outside of the waveguide. Next, CVD is used to deposit a silicon cover layer and CMP is used to planarize the deposited silicon cover layer and to yield a cover layer of the required thickness. (Note that the over-cladding would be equally effective in minimizing losses to the surrounding silicon if it is left as a blanket layer and not etched.)

The above-described SOI embodiments yield advantages in microelectronic circuits due to the low dielectric capacitance and high resistance of the substrate. There are a number of known ways of fabricating SOI structures, some of which are described in the above-mentioned article by B. Jalali et al. Two approaches that are useful for fabricating the embodiment of FIG. 1 are the bond-and-etchback SOI (BESOI) technique and the smart cut process.

According to the BESOI technique, a first silicon wafer is oxidized followed by a hydrophilic bonding of the oxide layer to the bare surface of a second silicon wafer. The first silicon wafer is then thinned and polished by mechanical and mechanical/chemical processes to the desired thickness. The optical signal circuits would be fabricated into the side of the second wafer that provides the bare surface. The thinned first silicon wafer would then provide the substrate into which the microelectronics are later fabricated.

According to the smart cut process, an oxidized silicon wafer is implanted with hydrogen through the oxide surface layer. After that, the oxide surface is bonded to the surface of a bare silicon wafer by hydrophilic bonding. During a subsequent heat treatment the first silicon wafer splits into two parts leaving a thin silicon layer on top of the oxide layer (thereby removing much of the silicon substrate). The new exposed surface of the silicon is then polished by mechanical and chemical/mechanical methods. In this case, the optical signal circuit would be fabricated into the surface of the bare silicon wafer prior to bonding that surface to the oxide surface of the first wafer.

Connecting the electrical signals between the microelectronics and optical-ready wafer components can be accomplished by standard etching of vias 59 (see FIG. 1) through the oxide into the optical-ready wafers which are subsequently connected electrically by standard means. Coupling of optical signals to the electronic layers or externally can be performed as described by M. H. Choi et. al. in "Self-Aligning Silicon Groove Technology Platform for the Low Cost Optical Module," IEEE 1999 Electronic Components and Technology Conference (pp. 1140–1144) or by Chen et al. in "Fully Embedded Board-Level Guided-Wave Optoelectronic Interconnects," Proceedings of the IEEE Vol. 88, No. 6, June 2000 (pp. 780–793).

Figure 2:
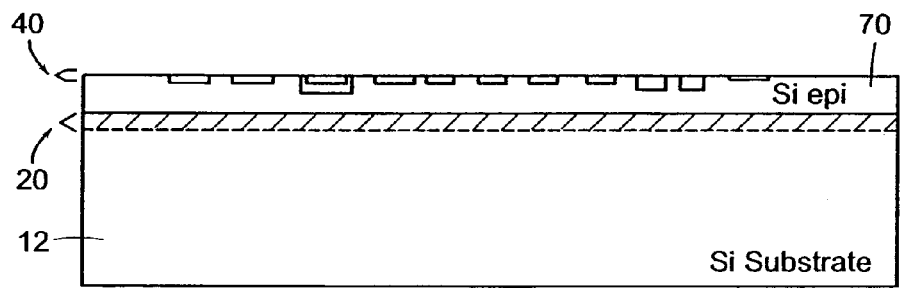
FIG. 2 is a schematic representation of a second embodiment of an optical-ready substrate.

Referring to FIG. 2, an alternative embodiment of the optical-ready substrate omits the insulator layer that is present in the SOI structure. In this non-SOI embodiment, after the optical signal distribution circuits are fabricated into the substrate, an epitaxial layer of silicon is grown directly on top of the substrate above the optical circuits. This epitaxial layer provides the substrate on which the integrated microelectronic circuits are fabricated using conventional semiconductor processing.

The epitaxial layer that is grown on top of the substrate containing the optical circuitry needs to be a single crystal material. Since the optical distribution network affects only a very small percentage of the total surface area, it will be possible to grow the epitaxial layer without having the areas in which the optical elements have been fabricated unacceptably compromising the quality of the resulting epitaxial layer.

Figure 4:
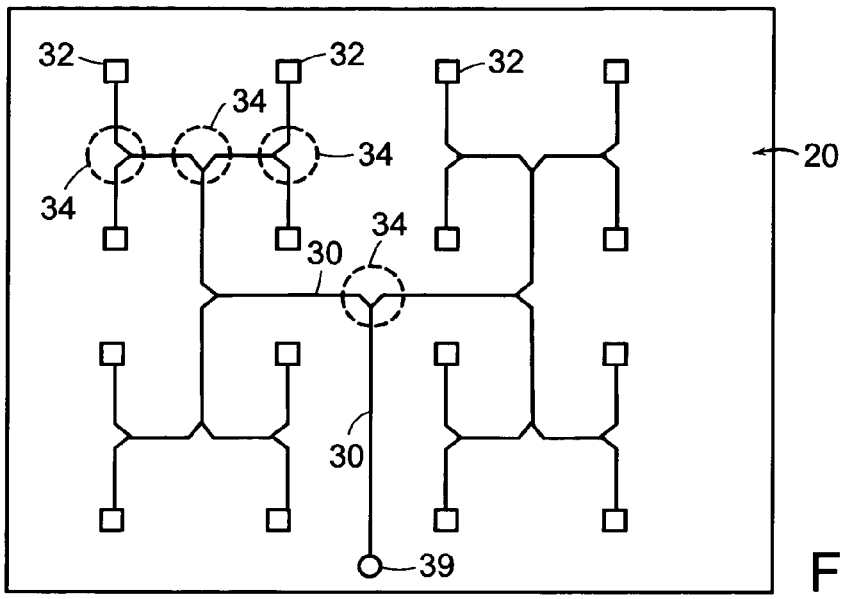
FIG. 4 shows an optical clock signal distribution network layout on a chip.

One can get a sense of the area that is required to fabricate such a circuit on a chip by reviewing the sizes of the individual structures that would have to be fabricated. In the optical clock signal distribution network, there will be a network of waveguides connected at branch points by splitters, and a number of detectors, one at the end of each waveguide. A representative clock distribution network when viewed from above might look like that depicted in FIG. 4. There might typically be from 8 to 128 domains to which the optical clock signal is delivered (FIG. 4 shows 16 domains). In each domain, there is phase lock loop (PLL) circuitry that converts the synchronous clock signals to higher frequencies and delivers them to the local devices. In future electronic chips, direct connection of optical signals to local electronic circuits could occur without use of PLLs, magnifying the number of splittings and detectors into thousands or even millions.

Typically, the waveguides might be about 3 μm (micrometer) wide and the detectors might be about 10 μm by 10 μm. And as just mentioned, the number of clock points (i.e., points at which a clock signal is delivered up to the microelectronics) might be from 8 to 128. In contrast, the chip might typically be about 20 mm on a side.

Still another embodiment omits any layers on top of the substrate in which the optical circuitry is fabricated. That is the integrated microelectronic circuitry is fabricated directly on top of the surface of the substrate In the case of the optical-ready embodiments which include only an epitaxial layer above the optical circuitry or which have no layers above the optical circuitry, it should be kept in mind that the components created on the optical-ready wafer must be created in a manner that leaves a crystalline surface on top that is adequate for subsequent electronic fabrication. Furthermore, the optical components must be created sufficiently robust to survive subsequent processing steps needed for microelectronic fabrication. The most stringent of these is probably thermal processing up to 1000° C. for several minutes. The high temperature processing limitation may, for example, preclude use of aluminum wires within the optical-ready substrate. However, electrical connections that are made with doped silicon and silicides can withstand these processing temperatures with proper design of tolerances. The electrical devices can be fabricated with conventional processes such as ion implantation processes and etch and redeposition processes, just to name two. If desired to connect to the electrical layer or otherwise, electrical connections with metal wires can be performed in a subsequent electronic microfabrication step using the same wiring techniques used to connect the electronic components being fabricated.

Figure 5:
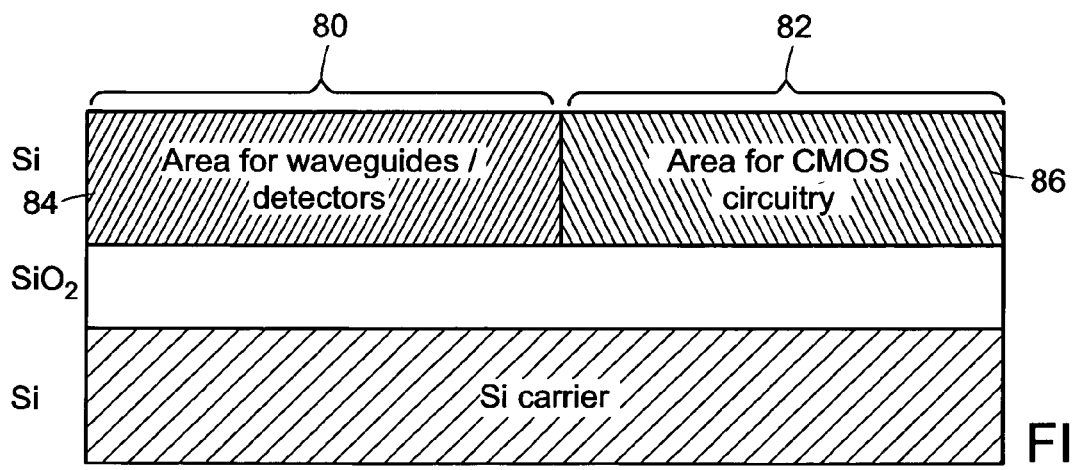
FIG. 5 is a schematic representation of an embodiment in which the optical signal distribution circuitry and the microelectronic circuitry are in separate regions that lie next to each other on the same plane.
Figure 6:
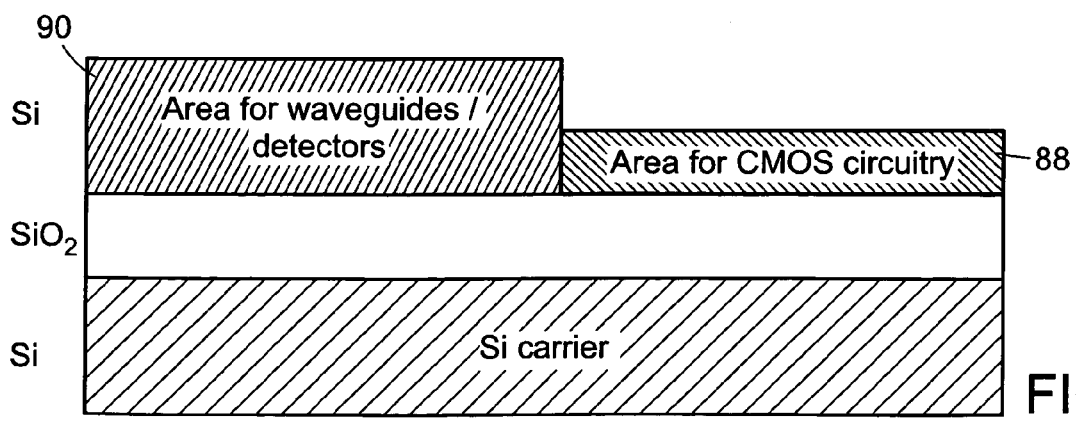
FIG. 6 is a schematic representation of another embodiment in which the optical signal distribution circuitry and the microelectronic circuitry are in separate regions that lie next to each other on the same plane.
Figure 7:
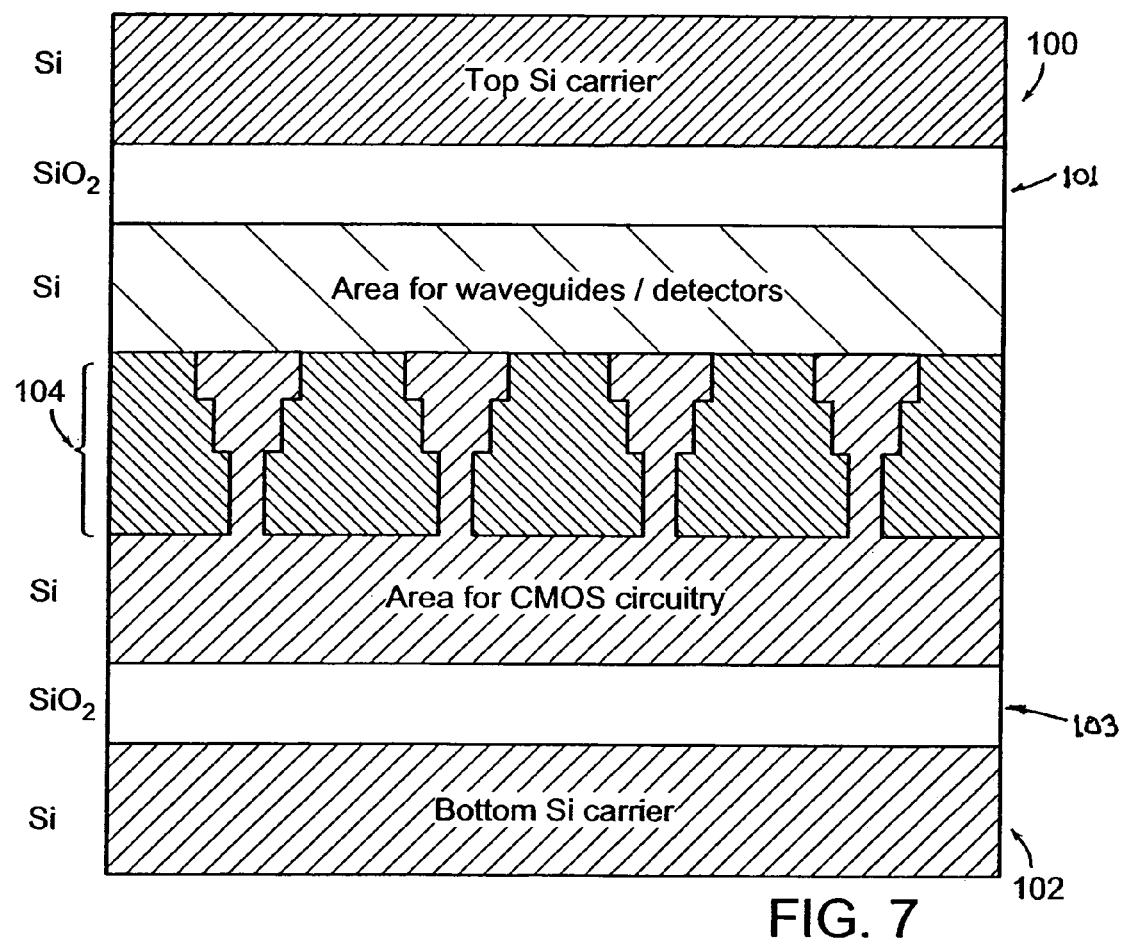
FIG. 7 is a schematic representation of the "flip-chip" embodiment.

In the embodiments described above, the microelectronics is fabricated above or on top of the microphotonics thus producing a vertical arrangement. It may, however, be desirable to arrange the two regions (i.e., the area holding the microelectronics and the area holding the microphotonics) horizontally on the same plane. In other words, the two regions lie on the same upper plane of the substrate but in different areas. Schematic representations of this approach are shown in FIGS. 5–7. In each of these embodiments, SOI wafers are used. As will become apparent below, the choice of SOI enables the integration of CMOS devices in the same Si layer.

In the embodiment shown in FIG. 5, all fabrication is done in the top silicon layer which might typically be from 0.5 to 10 μm thick. The surface area of each chip that is to be produced on the substrate is divided into two areas, a first area 80 in which the optical signal distribution circuitry is fabricated and a second area 82 in which the microelectronic circuitry is fabricated. In first area 80, semiconductor fabrication processes are used, as discussed previously, to fabricate the various microphotonic components of the optical distribution circuitry 84. If the optical circuitry is for the purpose of optical clock signal distribution, then the components might, as discussed above, typically be the waveguides and y-splitters that are necessary to distribute the optical signal, the input components that are necessary to receive the optical clock signal from off-chip sources, and the detectors that are necessary to convert the optical signals to electrical signals that can be used by the microelectronics that are located in the second area.

After fabrication within first area 80 is complete, the result is an optical-ready substrate. The optical-ready substrate is then shipped to the integrated circuits manufacturer that purchased the substrate and that manufacturer, using what are likely to be conventional semiconductor fabrication processes, fabricates the microelectronic circuitry 86 into second area 82 of each chip on the wafer. In the illustrated embodiment, microelectronic circuitry 86 is CMOS circuitry fabricated by using well-known CMOS semiconductor processing technology. The electrical signals from the detectors within the first area can be provided to the corresponding microelectronic elements within the second are by metalizations (not shown) on the top of the wafer, as is commonly done for connecting electrical components.

Two advantages of this approach are that the semiconductor processing can be performed using tools existing in semiconductor manufacturers' fabrication facilities and it can be done with processes and materials that are compatible with CMOS processing. The Si layer is the top layer of a silicon-on-insulator (SOI) wafer. The insulating oxide layer beneath serves as the bottom cladding while a deposited silicon dioxide serves as an upper cladding. The high-speed detectors are formed in the same plane as the waveguides. High-speed CMOS devices are fabricated in the 0.5–10 um Si layer with or without the addition of mobility enhancing layers such as strained Si. High-speed performance can also be achieved through the Ge doping, ultra-high confinement, resonant cavity, plasmon or photonic bandgap effects or a combination thereof.

As noted above, FIG. 5 is only a schematic representation of the substrate. The area that is actually dedicated to the microphotonic components, as opposed to the microelectronics, is more likely distributed over the area of the chip in a more complicated way the details of which will depend on the layout of the microcircuits. That is, it is not likely to simply be as shown where one half of the chip is dedicated to the microphotonic components while the other half is dedicated to the microelectronics. As suggested by FIG. 4, the area dedicated to the microphotonic components is only a small fraction of the surface area and it is distributed in a branched manner.

Referring to FIG. 6, in a modification to the structure depicted in FIG. 5, the high-speed CMOS devices are fabricated in a thin Si layer 88 while the Si-based waveguides and detectors are fabricated in a thicker epitaxial Si or SiGe layer 90 that is selectively grown on top of the thin Si layer in areas set aside for the optical clock distribution circuitry. Again, metalization pathways deposited on the top of the chip are used to deliver the electric signals from the photodetectors on the optical portion of the chip to the microelectronic components on the other portion of the chip.

If for integration, cost, and/or yield reasons the layer for optical clock distribution needs to be separated from the CMOS circuitry, the stacked chip approach shown in FIG. 7 can be used. In this case, two SOI substrates are used, a first SOI substrate 100 in which the optical signal distribution circuitry is fabricated into the upper silicon layer 101 by using semiconductor fabrication processes designed for that purpose and a second SOI substrate 102 in which the microelectronic circuitry is fabricated into the upper silicon layer 103 by using semiconductor fabrication processes tailored for that purpose. The chips that result from the two wafers are then interconnected connected by flipping the optical chip over onto the top of the microcircuit chip. The required electrical connections between the two chips are made by using a known electrical interconnection technique, such as bump bonding.

A number of embodiments of the invention have been described. Nevertheless, it will be understood that various modifications may be made without departing from the spirit and scope of the invention.

For example, we have described embodiments in which all optical elements are in the lower (buried) level and none are in the levels in which the electrical components are fabricated. That is, they are all fabricated prior to beginning the fabrication of the electrical elements and the signals that are passed up the electrical components from the optical layer are electrical signals (not optical signals). Nevertheless, it may be desirable to relax the requirement that all optical elements be confined to the underlying optical layer and to instead fabricate one or more of the optical elements concurrently with the fabrication of the electrical components. For example, the electrical component fabricator might want the optical clock signals sent up to the electrical layer and the electrical component fabricator will supply the optical detectors in the electrical layer to convert the optical signals to electrical signals for that layer.

In addition, though we have described the substrate in which the micro-photonic elements are fabricated as a simple silicon substrate, that substrate could itself actually be a multi-layered structure. For example, it might be desirable to include in the base substrate a buried insulator that serves as the lower cladding to the waveguides that will be fabricated therein. In other words, the simplicity of the described embodiment is not meant to imply that other more complicated substrate configurations could not be used. The design of the underlying substrate will depend on the processing objectives and the functionality that is desired from the components that are to be fabricated therein.

Also, in the above-described embodiments, we have discussed using silicon as the substrate material. It should be understood, however, that other semiconductor materials could be used so the invention is not meant to be limited to only using silicon. For example, one could also implement the above-described structures in other materials including, for example, Ge, GaAs, InP and GaN. In addition, though we have used SOI as an example meaning silicon-on-insulator, the reader should understand that other semiconductor-insulator combinations could also be used.

The embodiments described herein implemented a optical network for distributing optical clock signals that are provided by an off-chip source. However, the optical circuit could be more sophisticated and could be designed to serve other purposes such as simply conveying optical signals between different locations on the microelectronic circuit or even performing optical signal processing. To implement these other embodiments would of course also require using additional optical components such as modulators, switches, and laser elements, just to name a few.

As we noted above, the optical-ready substrates can be fabricated by using SOI technology or they can be fabricated in other ways without using SOI technology. In addition, it should be understood that the optical-ready wafers can be fabricated using SOI technology for the entire wafer or for only local areas of the wafer (e.g. just for the transistors or just form the optical components).

Accordingly, other embodiments are within the scope of the following claims.

What is claimed is:

1. An article of manufacture comprising an optical-ready substrate made of a first semiconductor layer, an insulating layer on top of the first semiconductor layer, and a second semiconductor layer on top of the insulating layer, wherein the second semiconductor layer has a top surface and is laterally divided into two regions including a first region and a second region, the top surface of the first region into which fabrication of microelectronic circuitry has not yet begun being of a quality that is sufficient to permit microelectronic circuitry to be fabricated therein at a later time and said second region including an optical signal distribution circuit formed therein, said optical signal distribution circuit made up of semiconductor photonic elements interconnected by an optical waveguide made of a material that is transparent to an optical signal characterized by a wavelength of about 850 nanometers or less, said optical distribution circuit designed to provide signals to the microelectronic circuitry to be fabricated in the first region of the second semiconductor layer at said later time.

2. The article of manufacture of claim 1 wherein the second semiconductor layer comprises silicon.

3. The article of manufacture of claim 2 wherein the optical waveguide includes a core made of a material selected from the group consisting of silica and silicon oxynitride.

4. The article of manufacture of claim 3 wherein the core comprises silica.

5. The article of manufacture of claim 4 wherein the silica of the core is doped with $GeO_2$.

6. The article of manufacture of claim 3 wherein the optical waveguide includes a cladding material surrounding the core.

7. The article of manufacture of claim 6 wherein the cladding material comprises silica.

8. The article of manufacture of claim 7 wherein the semiconductor photonic elements of the optical signal distribution circuit include an optical element coupled to the optical waveguide for delivering signals carried by the waveguide to the microelectronic circuitry.

9. The article of manufacture of claim 8 wherein said output element is an optical detector which converts optical signals to electrical signals.

10. The article of manufacture of claim 7 wherein the optical signal distribution network is an optical clock signal distribution network.

11. The article of manufacture of claim 10 wherein the insulating layer comprises a silicon oxide.

12. The article of manufacture of claim 7 wherein the first semiconductor layer comprises silicon.

13. The article of manufacture of claim 7 wherein the combination of the first semiconductor layer, the insulating layer, and the second semiconductor layer is an SOI structure.

14. The article of manufacture of claim 7 wherein the second region of the second semiconductor layer is thicker than the first region of the second semiconductor layer.

15. The article of manufacture of claim 7 wherein the top surface of the first region is of a quality that is sufficient to permit CMOS circuitry to be formed therein at the later time.

16. The article of manufacture of claim 6 wherein at least the topside of the first semiconductor chip comprises silicon.

17. The article of manufacture of claim 16 wherein the optical waveguide includes a core made of a material selected from the group consisting of silica and silicon oxynitride.

18. The article of manufacture of claim 17 wherein the core comprises silica.

19. The article of manufacture of claim 18 wherein the silica of the core is doped with $GeO_2$.

20. The article of manufacture of claim 17 wherein the optical waveguide includes a cladding material surrounding the core.

21. The article of manufacture of claim 20 wherein the cladding material comprises silica.

* * * * *